US012723323B2

(12) United States Patent
Yang et al.

(10) Patent No.: US 12,723,323 B2
(45) Date of Patent: Sep. 1, 2026

(54) LIGAND-FREE PROCESSABLE PEROVSKITE SEMICONDUCTOR INK

(71) Applicant: The Regents of the University of California, Oakland, CA (US)

(72) Inventors: Peidong Yang, Kensington, CA (US); Maria C. Folgueras, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 267 days.

(21) Appl. No.: 18/578,691

(22) PCT Filed: Jul. 15, 2022

(86) PCT No.: PCT/US2022/073792
§ 371 (c)(1),
(2) Date: Jan. 11, 2024

(87) PCT Pub. No.: WO2023/288312
PCT Pub. Date: Jan. 19, 2023

(65) Prior Publication Data

US 2024/0218555 A1 Jul. 4, 2024

Related U.S. Application Data

(60) Provisional application No. 63/222,343, filed on Jul. 15, 2021.

(51) Int. Cl.
*C30B 7/06* (2006.01)
*C30B 29/12* (2006.01)

(52) U.S. Cl.
CPC ................ *C30B 7/06* (2013.01); *C30B 29/12* (2013.01)

(58) Field of Classification Search
CPC ........... C30B 7/06; C30B 29/12; H01L 21/20; H01L 29/04
See application file for complete search history.

(56) References Cited

U.S. PATENT DOCUMENTS

2012/0305918 A1* 12/2012 Shum ................ H01L 21/02521 438/488
2016/0251383 A1 9/2016 Zhu et al.
(Continued)

FOREIGN PATENT DOCUMENTS

CN 112048302 A 12/2020

OTHER PUBLICATIONS

Ackerman, J., "Preparation and luminescence of some [K2PtCl6] materials," Materials Research Bulletin, vol. 19, No. 6, Jun. 1984, 9 pages.

(Continued)

*Primary Examiner* — Robert M Kunemund
(74) *Attorney, Agent, or Firm* — McCoy Russell LLP

(57) ABSTRACT

A method of forming a phase-pure $Cs_2TeX_6$ powder can include: dissolving a precursor TeX in a solution; rapidly adding a stoichiometric amount of respective CsX precursor to the solution, resulting in $Cs_2TeX_6$ powder immediately precipitating out of the solution; removing excess solution from the solution, resulting in the phase-pure $Cs_2Te$ $X_6$ powder; washing the phase-pure $Cs_2Te$ $X_6$ powder; and drying the phase-pure $Cs_2Te$ $X_6$ powder.

20 Claims, 8 Drawing Sheets

(56) References Cited

U.S. PATENT DOCUMENTS

| | | | | |
|---|---|---|---|---|
| 2017/0233045 | A1* | 8/2017 | Nelson | B63B 59/02 114/219 |
| 2020/0189926 | A1* | 6/2020 | van Hest | H10K 85/50 |

OTHER PUBLICATIONS

Vázquez- Fernández, I. et al., "Vacancy-Ordered Double Perovskite Cs2Tel6 Thin Films for Optoelectronics," Chemistry of Materials, vol. 32, No. 15, Jul. 9, 2020, 9 pages.

Tan, Z. et al., "Lead-Free Perovskite Variant Solid Solutions Cs2Sn1—xTexCl6: Bright Luminescence and High Anti-Water Stability," Advanced Materials, vol. 32, No. 32, Aug. 13, 2020, 7 pages.

European Patent Office, Extended European Search Report Issued in Application No. 22843078.1, Sep. 3, 2025, Germany, 7 pages.

Pi, C. et al., "A reversible and fast-responsive humidity sensor based on a lead-free Cs2TeCl6 double perovskite," Materials Advances, vol. 2, No. 3, Jan. 22, 2021, 7 pages.

Guo, J. et al., "High-Stability Flexible X-ray Detectors Based on Lead-Free Halide Perovskite Cs2Tel6 Film," ACS Applied Materials, vol. 13, No. 20, May 17, 2021, 8 pages.

Folgueras, M. et al., "Ligand-free processable perovskite semiconductor ink," Nano Letters, vol. 21, No. 20, Oct. 6, 2021, 28 pages.

ISA Korean Intellectual Property Office, International Search Report and Written Opinion Issued in Application No. PCT/US2022/073792, Nov. 3, 2022, WIPO, 9 pages.

* cited by examiner $Cs_2TeCl_6$ $Cs_2TeBr_6$ $Cs_2TeI_6$

FIG. 2A

CAL
MSE
PVSK

LIGAND-FREE PROCESSABLE PEROVSKITE SEMICONDUCTOR INK

CROSS REFERENCE TO RELATED APPLICATIONS

The present application is a U.S. National Phase of International PCT Application number PCT/US2022/073792, entitled "LIGAND-FREE PROCESSABLE PEROVSKITE SEMICONDUCTOR INK", filed on Jul. 15, 2022. International Application number PCT/US2022/073792 claims priority to U.S. provisional Application No. 63/222,343, entitled "LIGAND-FREE PROCESSABLE PEROVSKITE SEMICONDUCTOR INK", filed on Jul. 15, 2021. The entire contents of the above-listed applications are hereby incorporated by reference for all purposes.

TECHNICAL FIELD

The present description relates generally to semiconductor fabrication, and more particularly to semiconductor ink.

BACKGROUND

Traditional covalent semiconductor systems such as silicon (Si), germanium (Ge), and gallium arsenide (GaAs) are widely used in the semiconductor industry due to their excellent intrinsic material properties of exciton binding energies smaller than room temperature thermal energy, high carrier concentrations, and high carrier mobilities. On top of this, the strong covalent bonding in these materials imbues high stability and long operating lifetimes, thus making them ideal candidates for applications in microelectronics, photovoltaics, lasers, etc.

However, the nature of this strong covalent bonding makes it very challenging to process these materials for device fabrication, requiring very complex, energy-intensive, and costly synthetic methods. As such, these covalent semiconductors are not solution processable. These materials cannot be disassembled into fundamental building blocks via simply dissolving the bulk solid-phase semiconductor or precursors in solvents, patterned or printed onto a substrate in this liquid-phase, and then reassembled back into their solid-phase semiconductor through solvent evaporation.

Thus, there remains a need for improved semiconductor systems and processing methods.

SUMMARY

Traditional covalent semiconductor systems have proven themselves highly advantageous in device applications due to their high carrier concentrations, excellent transport properties, and relatively long stability under operation. However, processing these systems for device fabrication is anything but facile, requiring very complex, energy-intensive, and costly synthetic methods.

Embodiments of the present disclosure are generally directed to a stable, ligand-free zero-dimensional (0D) perovskite semiconductor ink that can be used to make printable and/or patterned semiconductor-based electronics in one step. The 0D perovskite ink is composed of powders of vacancy-ordered double perovskite $A_2BX_6$ (where A=a monovalent cation; B=a tetravalent metal or semi-metal cation; and X=a halide anion) dissolved in the polar aprotic solvents of dimethyl sulfoxide (DMSO), N,N-dimethylformamide (DMF), or acetonitrile (ACN). The dissolution of these powders leads to the stabilization of their constituent isolated $[BX_6]^{2-}$ octahedral anions and free $A^+$ cations in solution, without the presence of ligands. Free A-site cations in solution can include the following: $Li^+$, $Na^+$, $K^+$, $Rb^+$, and $Cs^+$.

The stabilization of the fundamental perovskite units in solution creates multi-functional inks that remain stable for over a year and that will readily crystallize back to the $A_2BX_6$ crystalline phase upon application to and drying on (either via heating or $N_2$ gas drying) a variety of substrates, including glass, silicon, and cellulose wipes, through drop-casting, printing, spraying and painting. This novel, facile approach to process semiconductor systems by controlling the ionic lattice interactions allows for rapid transformation from a bulk crystalline system to a stabilized semiconductor ink and back to a crystalline system patterned into electronics.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below:

FIG. 2A illustrates an example of thin films produced by dropcasting $Cs_2TeCl_6$, $Cs_2TeBr_6$ and $Cs_2TeI_6$ DMF-based inks onto a heated glass substrate with an anti-solvent.

FIG. 2B illustrates an example of coatings produced by spraying or painting $Cs_2TeCl_6$, $Cs_2TeBr_6$, and $Cs_2TeI_6$ DMF-based inks onto laboratory cellulose wipes and drying with heat.

FIG. 2C illustrates an example of patterned $Cs_2TeI_6$ semiconductor microcrystals produced by stamping $Cs_2TeI_6$ DMF-based ink onto heated rice paper.

DETAILED DESCRIPTION

Figure 1A:
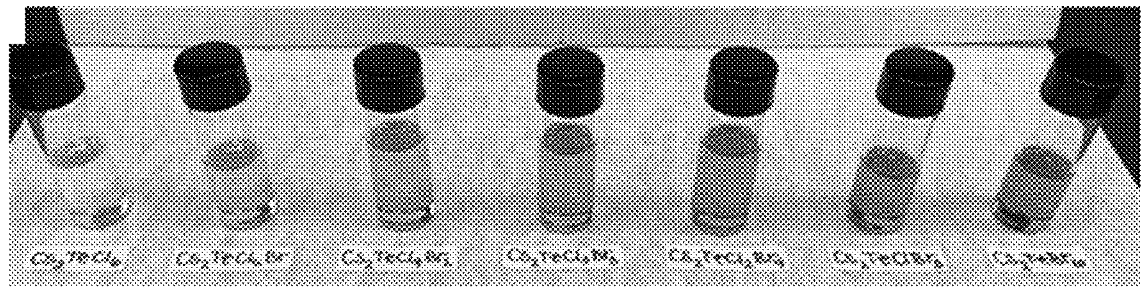
FIG. 1A illustrates an example in which color tunability from bright yellow to deep orange is observed across $Cs_2TeCl_{6-x}Br_x$ (x=0-6) mixed-halide inks.

Solution processability can be achieved much more easily from an ionic crystal structure, with halide perovskites such as $CsPbX_3$ and $CsSnX_3$ ($X=Cl^-$, $Br^-$, $I^-$) recently garnering much interest as such a processable semiconductor system. Their soft ionic lattices allow for ease of fabrication and result in excellent optoelectronic properties, making these materials viable options for applications in photovoltaics, light-emitting diodes, and photodetectors. Their low-cost solution processability has made them an attractive candidate for controlled patterning of devices, which could revolutionize the semiconductor device industry as well as flexible electronics.

Various studies have highlighted the development or use of solution-phase perovskites with varying stabilized building block units (i.e., quantum dots, solvated precursors, etc.) and how these inks can simply be deposited onto a substrate to fabricate semiconductor devices. However, true perovskite inks with stabilized A-site cations and $[BX_6]$ octahedral building blocks have yet to be achieved. Furthermore, achieving high-quality solution processing in ambient conditions is challenging for many of the traditional perovskite systems due to their environmental instability, primarily against moisture and oxygen. As a result, these systems have so far been fabricated in an inert atmosphere and usually require passivation and encapsulation processes.

To achieve a truly facile patterning process, the perovskite semiconductor solutions need to be stable while allowing for phase-pure perovskite formation in ambient conditions. Furthermore, the stability of these solutions should be achieved without the need for passivation, particularly through the means of ligands, as this would ultimately affect the resulting device performance.

Embodiments of the present disclosure are generally directed to a ligand-free, zero-dimensional (0D) perovskite semiconductor ink that can be easily converted within minutes in ambient conditions to its high-quality crystalline solid-phase perovskite upon application to and drying on various substrates. These inks of vacancy-ordered double perovskite $A_2BX_6$ ($A=Li^+$, $Na^+$, $K^+$, $Rb^+$, $Cs^+$; $B=Te^{4+}$, $Sn^{4+}$, $Zr^{4+}$, $Hf^{4+}$, $Pt^{4+}$, $Pd^{4+}$, $Se^{4+}$, $Ir^{4+}$; $X=Cl^-$, $Br^-$, $I^-$) can be stabilized in the polar aprotic solvents DMSO, DMF, and ACN from bulk $A_2BX_6$ semiconductor powders. In effect, the polar aprotic solvents serve to disassemble the extended perovskite ionic octahedron network (ION) of the $A_2BX_6$ bulk powders into its constituent building blocks.

The units stabilized in the pure-halide $Cs_2TeX_6$ inks are $Cs^+$ cations and $[TeX_{6-n}]^{+n-2}$ (n=0,1,2) complex anions, with the anion population favoring a majority of $[TeX_6]^{2-}$ octahedral complex anions at higher concentrations. It will be appreciated that the stabilized octahedral complexes in solution take the general form $[BX_6]^{2-}$. B-site cations of the stabilized octahedral complexes in solution can include: $Te^{4+}$, $Sn^{4+}$, $Zr^{4+}$, $Hf^{4+}$, $Pt^{4+}$, $Pd^{4+}$, $Se^{4+}$, and $Ir^{4+}$. X-site anions of the stabilized octahedral complexes in solution can include: $Cl^-$, $Br^-$, and $I^-$.

The stabilized complexes are critical to the ability of these inks to rapidly form phase-pure perovskite structures in ambient conditions. The formation of thin films, printed patterns, and dried paints (i.e., coatings) with these inks represents the reassembly of the solid-phase perovskite crystals directly from the liquid-phase perovskite ink in one simple step. The confirmation of a ligand-free ink of stabilized molecular complex anions represents the first known formation of a tunable 0D perovskite ink.

Phase-pure $Cs_2TeCl_6$, $Cs_2TeBr_6$, and $Cs_2TeI_6$ powders are formed via a simple anti-solvent solution method. The precursor $TeCl_4$ or $TeBr_4$ is dissolved in methanol at 60° C., and the precursor $TeI_4$ is dissolved in acetonitrile (ACN) at 75° C. The stoichiometric amount of respective CsX precursor is then rapidly added to the solution at a high spin speed. $Cs_2TeX_6$ powders immediately precipitate out of solution at ~100% yield. The excess solution is removed, and the powders are washed with methanol and dried.

Pure-halide inks of $Cs_2BX_6$ ($B=Te^{4+}$, $Sn^{4+}$, $Zr^{4+}$, $Hf^{4+}$, $Pt^{4+}$, $Pd^{4+}$, $Se^{4+}$, $Ir^{4+}$; $X=Cl^-$, $Br^-$, $I^-$) are formed by dissolving the respective pure-halide powder in the polar aprotic solvents of dimethyl sulfoxide (DMSO), N,N-dimethylformamide (DMF), or acetonitrile (ACN). Mixed-halide inks of $Cs_2BX_6$, representing the alloy spaces of $Cs_2BCl_{6-x}Br_x$ and $Cs_2BBr_{6-x}I_x$ (x=0–6), are formed by dissolving the appropriate ratio of pure-halide powders in the same polar aprotic solvents. For example, to form an ink of composition $Cs_2TeCl_3Br_3$, a 1:1 ratio of $Cs_2TeCl_6$:$Cs_2TeBr_6$ powders must be used. The same ink formation behavior is achieved when dissolving $Cs_2BX_6$ single crystals in either DMSO, DMF, or ACN, or when dissolving the stoichiometric amount of respective $Cs_2TeX_6$ precursors (2CsX and $TeX_4$) in either DMSO, DMF, or ACN.

Figure 1B:
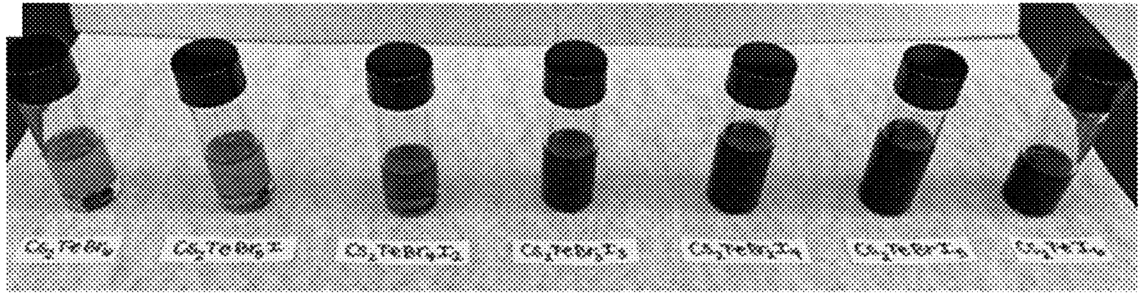
FIG. 1B illustrates an example in which color tunability from deep orange to black is observed across $Cs_2TeBr_{6-x}I_x$ (x=0-6) mixed-halide inks.

It is not possible to dissolve $SnCl_4$ or $SnBr_4$ in either DMSO, DMF, or ACN due to the strong Lewis acid-base interaction with DMSO. DMF, or ACN. However, creation of a bulk powder form of $Cs_2SnX_6$ removes this reactivity and allows for the dissolution in polar aprotic solvents to form $Cs_2SnX_6$ inks. The formation of mixed-halide inks creates a tunable solution-phase composition space from bright yellow to deep orange in $Cs_2TeCl_{6-x}Br_x$ (x=0–6) inks, as illustrated by FIG. 1A, and from deep orange to black in $Cs_2TeBr_{6-x}I_x$ (x=0–6) inks, as illustrated by FIG. 1B.

Figure 1C:
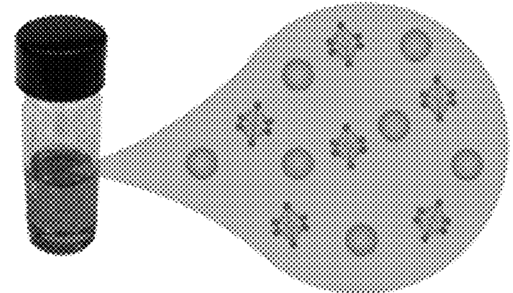
FIG. 1C illustrates an example Schematic of constituent $Cs_2TeBr_6$ lattice elements stabilized in the ink.

By starting from the bulk $Cs_2TeX_6$ semiconductor system, a tunable $Cs_2TeX_6$ semiconductor ink composition space can be formed simply by dissociating the extended $Cs_2TeX_6$ ionic crystals into their constituent ions, i.e. solvated $Cs^+$ cations and $[TeX_6]^{2-}$ octahedral complex anions, as illustrated by FIG. 1C. It will be appreciated that free A-site cations in solution can include the following: $Li^+$, $Na^+$, $K^+$, $Rb^+$, and $Cs^+$.

Figure 1D:
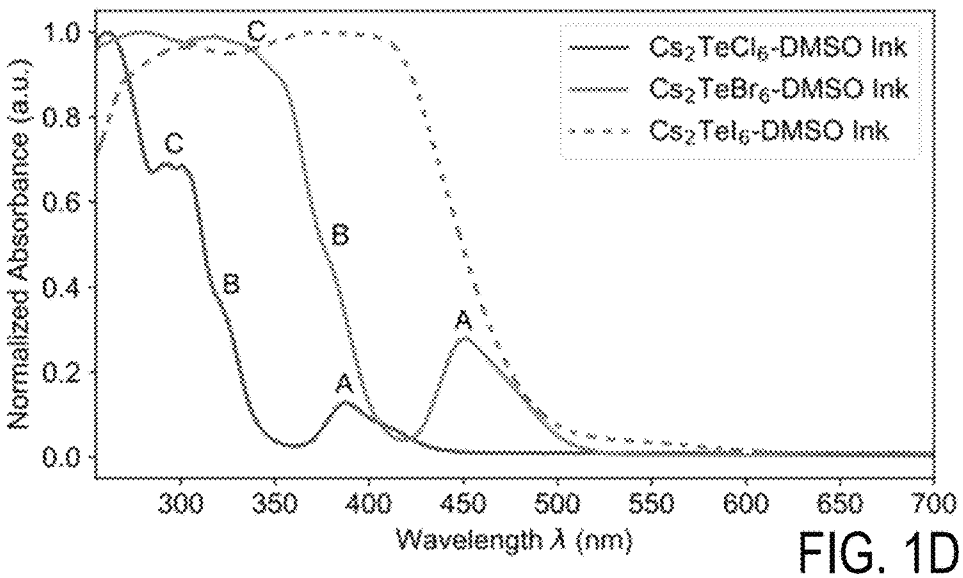
FIG. 1D illustrates an example of absorption spectra of $Cs_2TeCl_6$, $Cs_2TeBr_6$, and $Cs_2TeI_6$ DMSO-based inks, where the characteristic absorbance features of molecular octahedral complexes (A, B, and C bands) are indicated for the $Cs_xTeCl_6$ and $Cs_2TeBr_6$ inks.

UV-vis absorption spectroscopy measurements suggest the presence of these solvated $[TeX_6]^{2-}$ octahedral complex anions stabilized within the $Cs_2TeCl_6$ and $Cs_2TeBr_6$ DMSO-based inks, as illustrated by FIG. 1D. These spectra reveal the A, B, and C absorbance bands expected from molecular octahedral complexes. These 3 groups of absorbance bands match that which have been previously observed for Te-based molecular octahedral complexes. These spectra also have strong absorbance features in the UV range, which potentially correspond to undercoordinated Te-based complexes (i.e., $[TeX_4]$ and $[TeX_5]^-$).

Given the solution-phase nature of this system, it is likely that there is an equilibrium reaction of $[TeX_6]^{2-} \rightleftharpoons [TeX_{6-n}]^{+n-2}+nX^-$ (n=1,2) occurring within the inks at room temperature. The characteristic absorbance signatures of molecular octahedral complexes are not immediately identifiable in the absorption spectrum of the $Cs_2TeI_6$ DMSO-based ink.

Figures 2A, 2B, 2C:
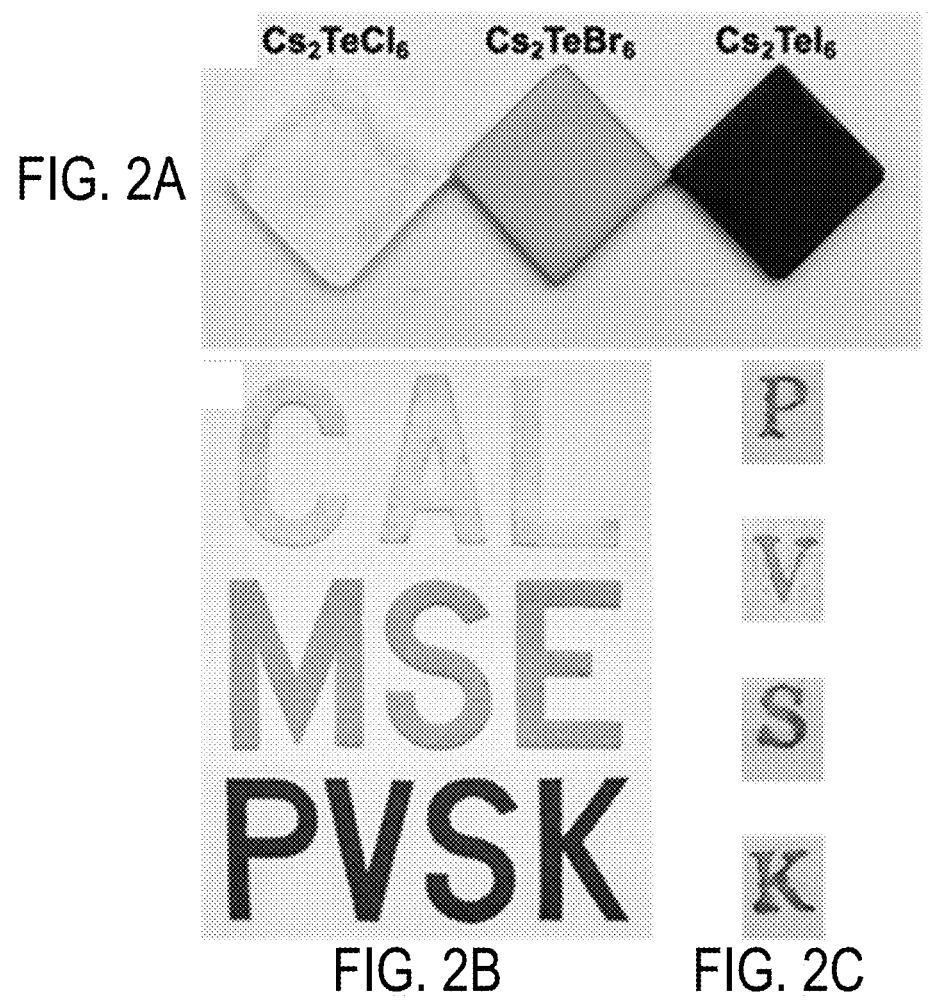

High quality crystalline thin films can be produced from the inks via dropcasting onto glass or silicon (i.e., as illustrated by FIG. 2A), representing the re-assembly of the $Cs_2TeX_6$ crystals from the solution-phase. The solution-phase transforms in one minute back to the $Cs_2TeX_6$ thin film with the assistance of heat and an anti-solvent to accelerate solvent evaporation and improve film coverage and morphology (i.e., by spreading the solution and increasing the number of nucleation events), respectively.

These thin films possess tunable color like their single crystal and powder counterparts, from bright yellow for $Cs_2TeCl_6$ to bright orange for $Cs_2TeBr_6$ to black for $Cs_2TeI_6$. Due to the higher solubility of CsBr and CsI salts, higher solution concentrations can be achieved for the $Cs_2TeBr_6$ and $Cs_2TeI_6$ inks.

Unlike the use of acid-base pair oleic acid-oleylamine typically employed to stabilize confined perovskite systems and perovskite nanocrystal-based inks, the stabilization of solvated molecular Te-complex anions in ligand-free solutions should allow for the formation of higher-quality perovskite thin films. Concretely, despite the absence of stabilizing ligands, the constituent cations and anionic molecules in solution simply begin to more strongly interact and form the perovskite ionic lattice during evaporation of the solvent.

Additionally, because ligands are not necessary to stabilize the constituent ions, their absence in thin film preparation benefits the material's properties for device applications. Specifically, ligands are known to hinder charge transport in materials, thus lowering device performance.

In addition to being used for thin film formation, these inks can also be used in patterning applications, either by spraying or painting on synthetic fibers or by stamping on rice (Xuan) paper. High quality microcrystalline dried paints (coatings) can be produced from the inks by using a spray airbrush or a paint brush onto synthetic fibers such as cellulose wipes, as illustrated by FIG. 2B. The semiconductor ink transforms within minutes back to the $Cs_2TeX_6$ semiconductor coating with the assistance of heat. Similarly, patterned $Cs_2TeX_6$ microcrystals can be achieved by coating stamps with the inks and pressing onto heated rice paper, as illustrated by FIG. 2C. The solution-phase transforms back to the solid-state $Cs_2TeX_6$ semiconductor within a minute without spreading along the paper, thus achieving $Cs_2TeX_6$ perovskite patterning from its corresponding ink through a form of printing. These patterning results indicate that inkjet printing of these $Cs_2TeX_6$ inks is possible.

The formation of dried paints or coatings onto synthetic fabrics and rice paper represents another route toward re-assembly of the $Cs_2TeX_6$ semiconductor from the solution-phase. These coatings possess tunable color like their single crystal and powder counterparts. As a result of the higher concentrations of the $Cs_2TeBr_6$ and $Cs_2TeI_6$ inks, much darker pigments can be achieved for these two compositions. However, given that the coverage of the ink is controlled by a paint brush and the thickness of the resulting coating is controlled by the thickness of the cellulose wipes, many crystalline parameters are similar across the three coatings.

Figure 2D:
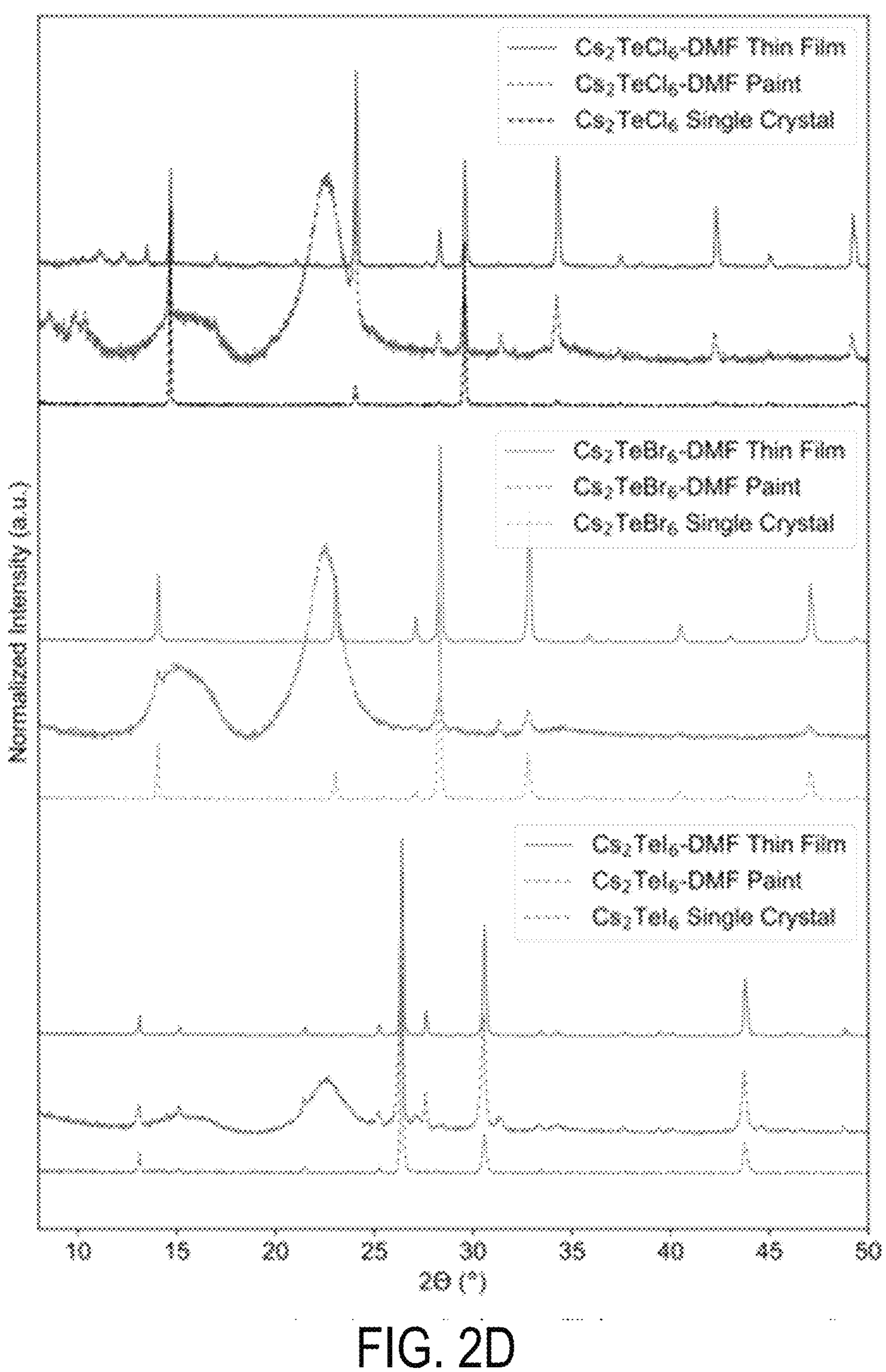
FIG. 2D illustrates an example of powder X-ray diffraction (PXRD) patterns of the pictured $Cs_2TeX_6$ thin films and coatings, as compared with that of the corresponding single crystals.

The formation of $Cs_2TeCl_6$, $Cs_2TeBr_6$, and $Cs_2TeI_6$ thin films and dried paints (e.g., coatings) can be confirmed via powder X-ray diffraction (PXRD), Raman spectroscopy, and UV-vis absorption spectroscopy. The thin films and the coatings of all three pure-halide compositions have a face-centered cubic (FCC) crystal structure with a tunable lattice parameter from 10.47 Å for $Cs_2TeCl_6$, 10.92 Å for $Cs_2TeBr_6$, and 11.69 Å for $Cs_2TeI_6$, as illustrated by FIG. 2D.

Figure 2E:
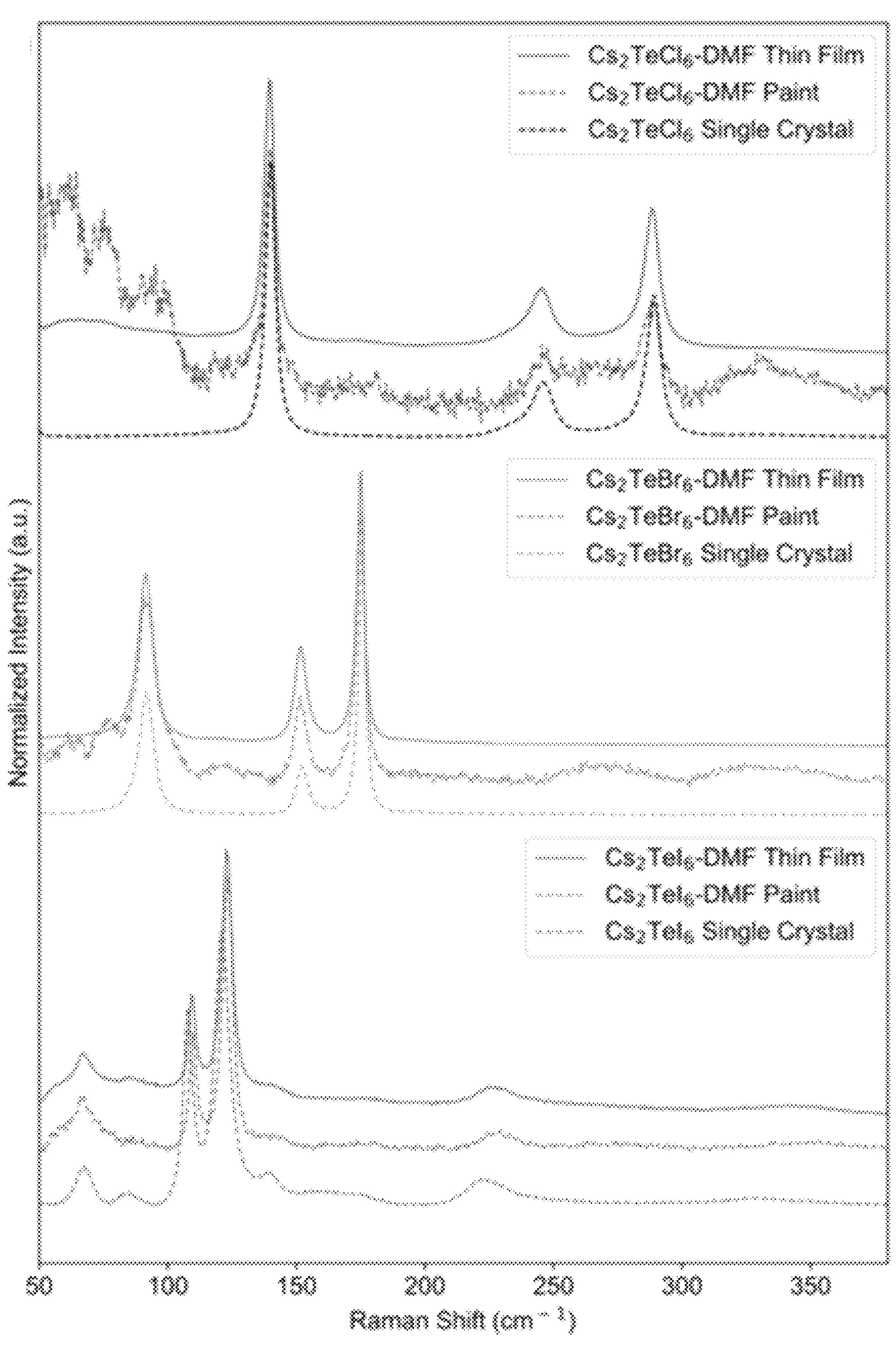
FIG. 2E illustrates an example of Raman spectra of the pictured $Cs_2TeX_6$ thin films and coatings, as compared with that of the corresponding single crystals.

The Raman spectra of these thin films and coatings show three fundamental modes that are representative of the expected $O_h$ symmetry of these compositions, as illustrated by FIG. 2E. These same three fundamental modes present in the Raman spectra of the corresponding single crystals and powders. The modes of the $Cs_2TeI_6$ thin film and coating are shifted to slightly higher frequencies relative to those of the $Cs_2TeI_6$ single crystal, representing a strain difference between these different morphologies.

Figure 2F:
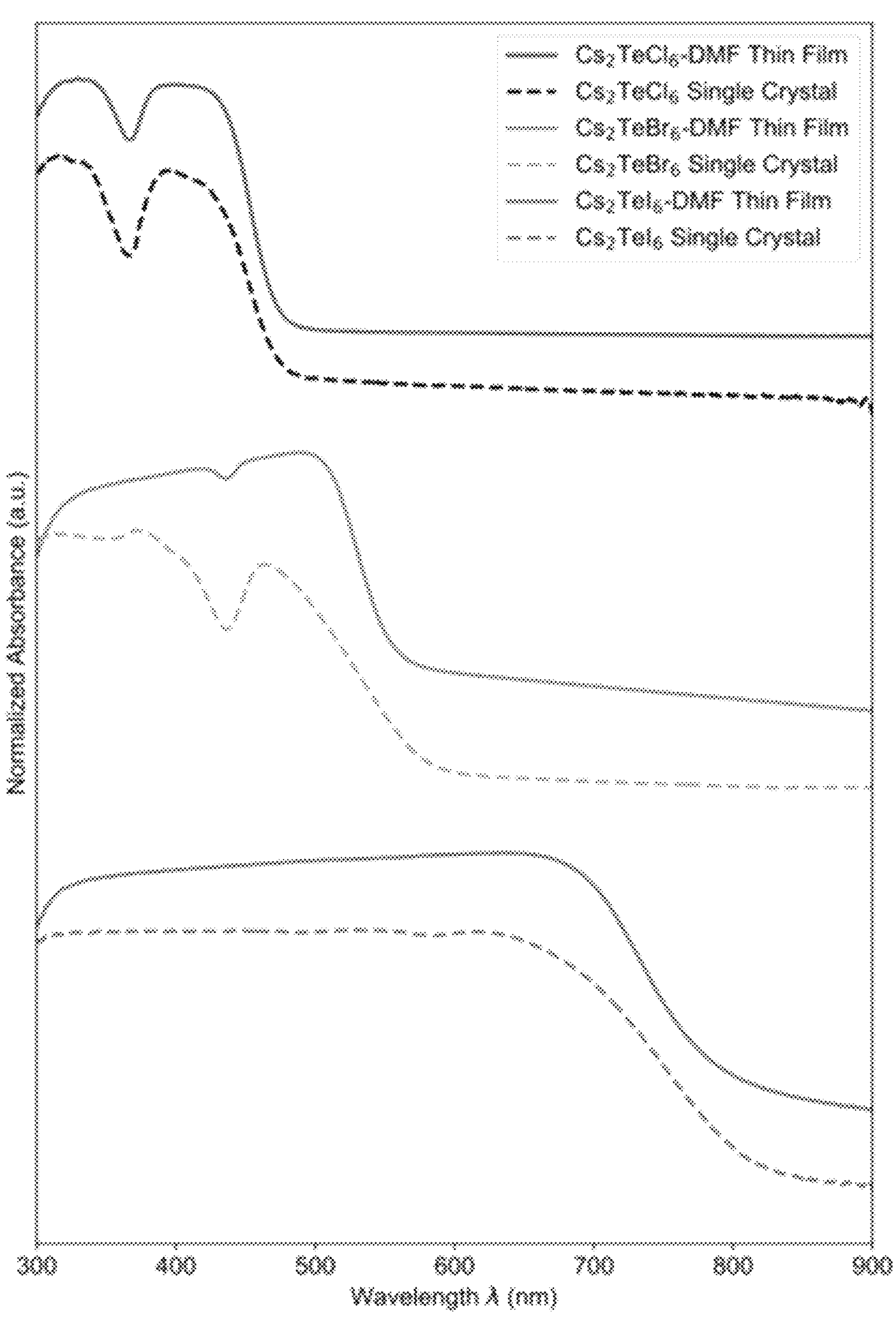
FIG. 2F illustrates an example of absorption spectra of the pictured $Cs_2TeX_6$ thin films, as compared with that of the corresponding single crystals.
Figure 2G:
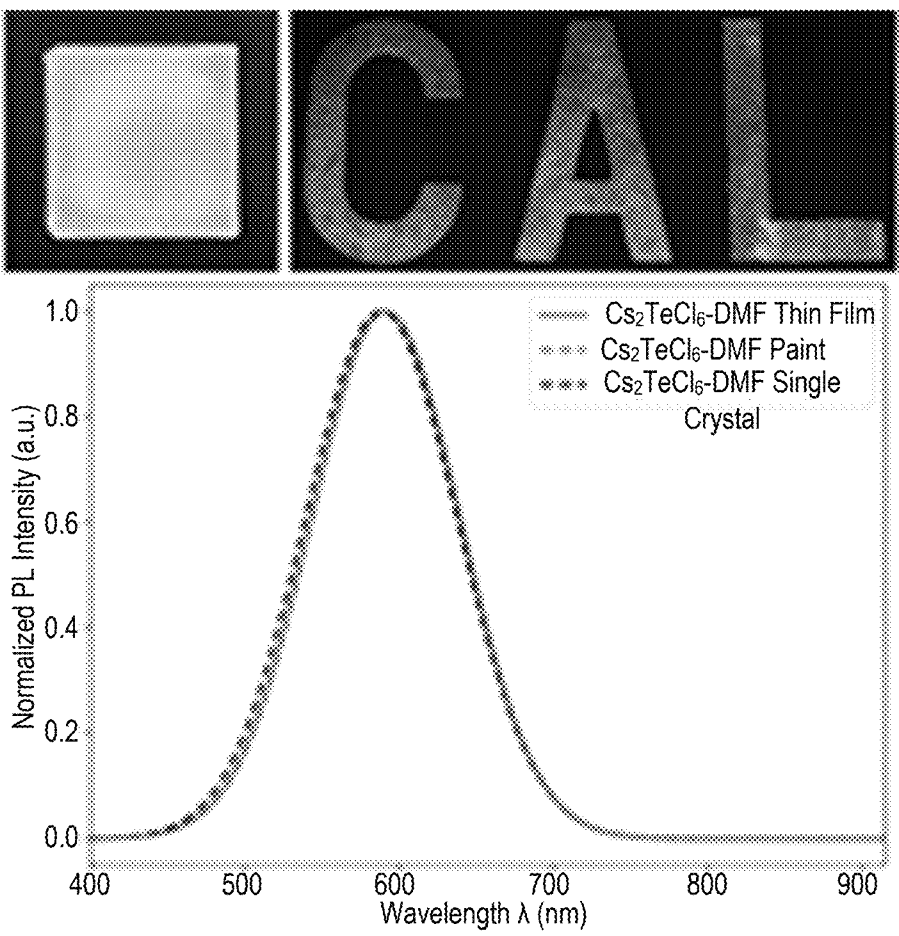
FIG. 2G illustrates an example of photoluminescence imaging and spectra of the pictured $Cs_2TeCl_6$ thin film and coating, with the spectra compared with that of the corresponding single crystal.

The absorbance of the pure-halide thin films shows the same behavior as that of the single crystals and powders, with molecule-like features appearing in the absorption spectra of the $Cs_2TeCl_6$ and $Cs_2TeBr_6$ morphologies and typical dispersive density of states features appearing in the absorption spectrum of the $Cs_2TeI_6$ morphologies. The absorption onset also remains constant between the respective compositions in thin film or single crystal form (see FIG. 2F). The strong yellow photoluminescence of $Cs_2TeCl_6$ single crystals is maintained in the $Cs_2TeCl_6$ thin film and coatings, as illustrated by FIG. 2G.

Figure 3A:
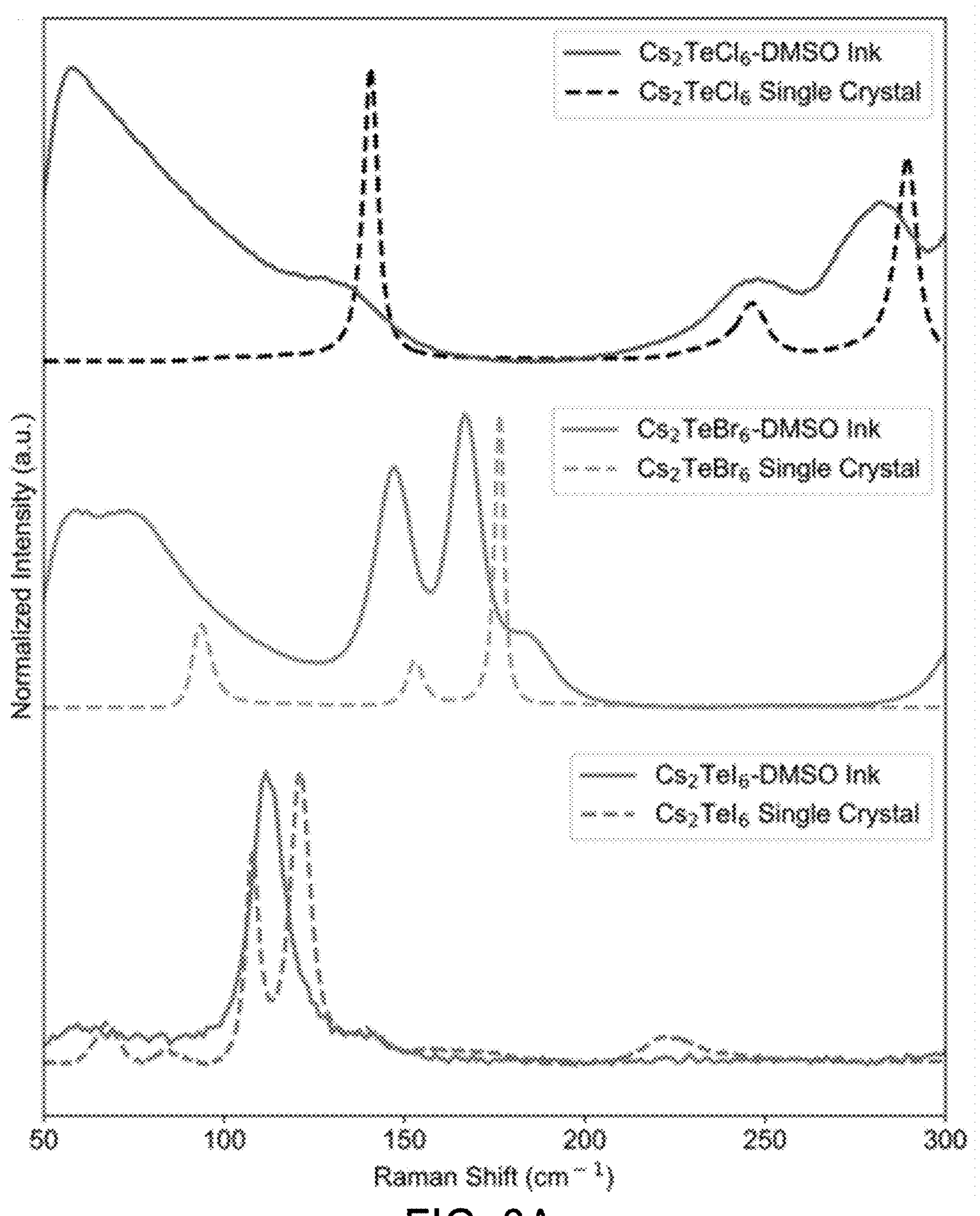
FIG. 3A illustrates an example of Raman spectra of $Cs_2TeCl_6$, $Cs_2TeBr_6$, and $Cs_2TeI_6$ DMSO-based inks, as compared with that of the corresponding single crystals.

Understanding what complexes have been stabilized in these solutions is critical to understanding the ability of these inks to rapidly form phase-pure perovskite structures in ambient conditions. Solution Raman data of the $Cs_2TeCl_6$ and $Cs_2TeBr_6$ DMSO-based inks indicate 3 modes in the correct frequency range (based on Raman measurements of $Cs_2TeX_6$ single crystals and powders) corresponding to the expected $O_h$ symmetry of perfect octahedral complex anions, as illustrated by FIG. 3A. However, the increased linewidth brought about by the liquid phase could be masking modes corresponding to other symmetry units stabilized within solution.

Figure 3B:
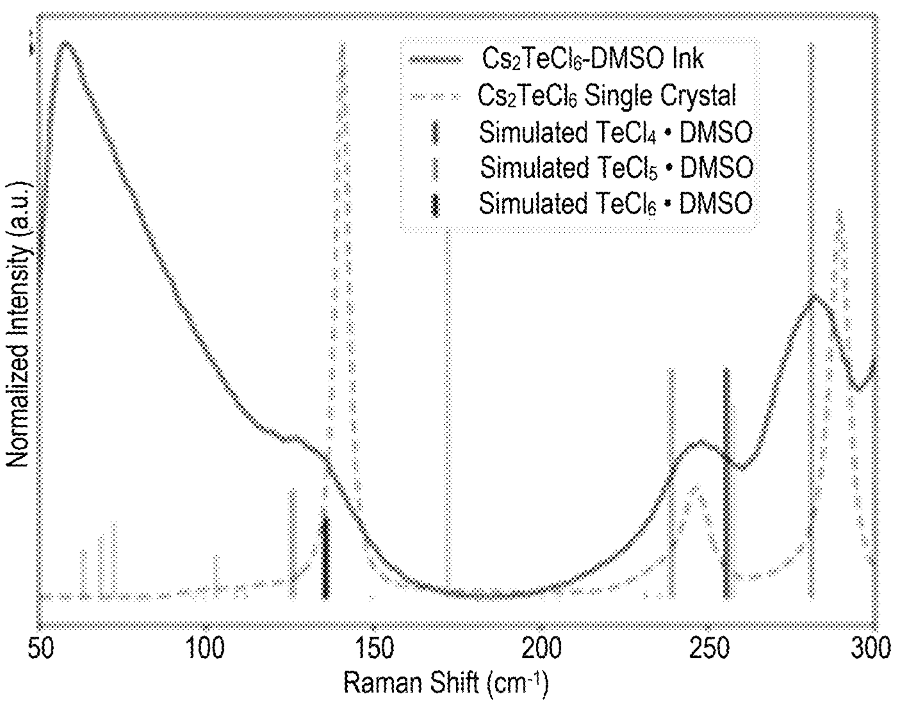
FIG. 3B illustrates an example comparison of experimental Raman spectrum of the $Cs_2TeCl_6$ DMSO-based ink and simulated Raman spectra of 4-, 5-, and 6-coordinate Te—Cl complexes.
Figure 3C:
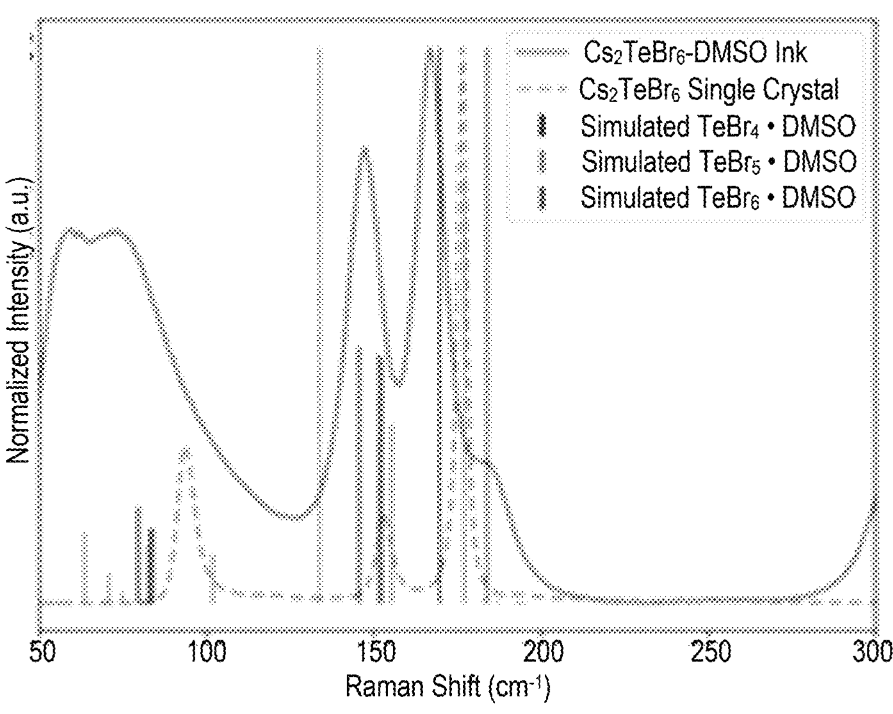
FIG. 3C illustrates an example comparison of experimental Raman spectrum of the $Cs_2TeBr_6$ DMSO-based ink and simulated Raman spectra of 4-, 5-, and 6-coordinate Te—Br complexes.

From the solution absorption spectra presented in FIG. 1D, these inks likely stabilize 4-, 5-, and 6-coordinate Te—X complexes and potentially stabilize 6-coordinate Te—X-solvent complexes. The close similarities of frequencies for the modes resulting from the symmetry units of all-inorganic 4-, 5-, and 6-coordinate complexes were confirmed with a Raman simulation determined within a solvent model for $Cs_2TeCl_6$ and $Cs_2TeBr_6$ DMSO-based inks, as illustrated by FIGS. 3B and 3C. Other advanced spectroscopic measurements may be collected to confirm the coordination-complexes that are stabilized in the $Cs_2TeCl_6$ and $Cs_2TeBr_6$ inks.

The solution Raman spectrum of the $Cs_2TeI_6$ DMSO-based ink does not show 2 modes in the frequency range 100-130 $cm^{-1}$ as seen in the spectrum of $Cs_2TeI_6$ single crystals or powders. These 2 modes represent the symmetric and asymmetric stretching modes of a coordination environment possessing $O_h$ symmetry. This absence of these 2 modes in the solution Raman spectrum indicates either that those 2 modes are smeared together due to the linewidth broadening inherent to the liquid-phase, or that the 2 modes are indeed not present and the system has assumed a different coordination environment in the liquid phase (i.e., the $O_h$ symmetry in the solid phase is not preserved in the liquid phase). Other advanced spectroscopic measurements may be collected to resolve this discrepancy and identify which coordination-complexes are stabilized in the $Cs_2TeI_6$ ink.

The previously described versions of the disclosed subject matter have many advantages that were either described or would be apparent to a person of ordinary skill. Even so, these advantages or features are not required in all versions of the disclosed apparatus, systems, or methods.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of forming a phase-pure $Cs_2TeX_6$ powder, the method comprising:

dissolving a precursor $TeX_4$ in a solution;

rapidly adding a stoichiometric amount of respective CsX precursor to the solution, resulting in $Cs_2TeX_6$ powder immediately precipitating out of the solution;

removing excess solvent from the solution, resulting in the phase-pure $Cs_2TeX_6$ powder;

washing the phase-pure $Cs_2TeX_6$ powder; and drying the phase-pure $Cs_2TeX_6$ powder, wherein the phase-pure $Cs_2TeX_6$ powder includes $Cs_2TeBr_6$ and the precursor $TeX_4$ includes $TeBr_4$, wherein the $TeBr_4$ is dissolved in methanol.

2. The method of claim 1, wherein the $TeBr_4$ is dissolved in the methanol at 60° C.

3. A method of forming a phase-pure $Cs_2TeX_6$ powder, the method comprising:

dissolving a precursor $TeX_4$ in a solution;

rapidly adding a stoichiometric amount of respective CsX precursor to the solution, resulting in $Cs_2TeX_6$ powder immediately precipitating out of the solution;

removing excess solvent from the solution, resulting in the phase-pure $Cs_2TeX_6$ powder;

washing the phase-pure $Cs_2TeX_6$ powder; and drying the phase-pure $Cs_2TeX_6$ powder, wherein the phase-pure $Cs_2TeX_6$ powder includes $Cs_2TeI_6$ and the precursor $TeX_4$ includes $TeI_4$, wherein the $TeI_4$ is dissolved in acetonitrile.

4. The method of claim 3, wherein the $TeI_4$ is dissolved in the acetonitrile at 75° C.

5. The method of claim 1, wherein the stoichiometric amount of respective CsX precursor is added to the solution at a high spin speed.

6. The method of claim 1, wherein washing the phase-pure $Cs_2TeX_6$ powder comprises washing the phase-pure $Cs_2TeX_6$ powder with methanol.

7. The method of claim 1, wherein the $Cs_2TeX_6$ powder precipitates at 100% yield.

8. The method of claim 1, further comprising producing a high-quality crystalline thin film via dropcasting the phase-pure $Cs_2TeX_6$ powder onto a substrate.

9. The method of claim 8, wherein the substrate is glass or silicon.

10. The method of claim 8, further comprising applying heat and an anti-solvent to accelerate solvent evaporation and improve film coverage and morphology.

11. The method of claim 8, wherein the high-quality crystalline thin film has a tunable color.

12. The method of claim 11, wherein the high-quality crystalline thin film is $Cs_2TeCl_6$ and the tunable color is bright yellow.

13. The method of claim 11, wherein the high-quality crystalline thin film is $Cs_2TeBr_6$ and the tunable color is bright orange.

14. The method of claim 11, wherein the high-quality crystalline thin film is $Cs_2TeI_6$ and the tunable color is black.

15. The method of claim 3, wherein the stoichiometric amount of respective CsX precursor is added to the solution at a high spin speed.

16. The method of claim 3, wherein washing the phase-pure $Cs_2TeX_6$ powder comprises washing the phase-pure $Cs_2TeX_6$ powder with methanol.

17. The method of claim 3, wherein the $Cs_2TeX_6$ powder precipitates at 100% yield.

18. The method of claim 3, further comprising producing a high-quality crystalline thin film via dropcasting the phase-pure $Cs_2TeX_6$ powder onto a substrate.

19. The method of claim 18, further comprising applying heat and an anti-solvent to accelerate solvent evaporation and improve film coverage and morphology.

20. The method of claim 18, wherein the high-quality crystalline thin film has a tunable color.

* * * * *